US011004491B2

(12) United States Patent
Gupta et al.

(10) Patent No.: US 11,004,491 B2
(45) Date of Patent: May 11, 2021

(54) TWISTED WORDLINE STRUCTURES

(71) Applicant: GLOBALFOUNDRIES U.S. INC., Santa Clara, CA (US)

(72) Inventors: Anuj Gupta, Sunnyvale, CA (US); Bipul C. Paul, Mechanicville, NY (US); Joseph Versaggi, Galway, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/582,474

(22) Filed: Sep. 25, 2019

(65) Prior Publication Data

US 2021/0090627 A1    Mar. 25, 2021

(51) Int. Cl.
*G11C 5/06* (2006.01)
*G11C 11/16* (2006.01)

(52) U.S. Cl.
CPC ........ *G11C 11/1657* (2013.01); *G11C 11/161* (2013.01); *G11C 11/1655* (2013.01); *G11C 11/1659* (2013.01)

(58) Field of Classification Search
CPC .................................................. G11C 11/161
USPC .......................................................... 365/63
See application file for complete search history.

(56) References Cited

U.S. PATENT DOCUMENTS

| | | | |
|---|---|---|---|
| 5,644,526 A | 7/1997 | Mazzali | |
| 5,933,725 A | 8/1999 | Kirsch et al. | |
| 5,940,315 A | 8/1999 | Cowles | |
| 6,611,062 B2 | 8/2003 | Kurjanowicz | |
| 7,675,124 B2 | 3/2010 | Liaw | |
| 8,441,850 B2 | 5/2013 | Lee et al. | |
| 8,921,179 B2 | 12/2014 | Paul et al. | |
| 9,496,314 B1* | 11/2016 | Lu | G11C 11/1659 |
| 2002/0140106 A1* | 10/2002 | Kurjanowicz | H01L 23/5225 257/776 |
| 2006/0274596 A1 | 12/2006 | Kim et al. | |
| 2007/0164372 A1 | 7/2007 | McDaniel et al. | |
| 2012/0087184 A1 | 4/2012 | Lee et al. | |
| 2013/0235639 A1 | 9/2013 | Lee | |

OTHER PUBLICATIONS

Office Action dated Oct. 23, 2019 in related U.S. Appl. No. 16/214,450, 16 pages.
Dong-Sun Min et al., "Wordline coupling noise reduction techniques for scaled DRAMs", IEEE Symposium on VLSI Circuits, 1990, 2 pages.
Specification and Figures for related U.S. Appl. No. 16/214,450, filed Dec. 10, 2018.

* cited by examiner

*Primary Examiner* — Hoai V Ho
(74) *Attorney, Agent, or Firm* — Andrew M. Calderon; Roberts Calderon Safran & Cole, P.C.

(57) ABSTRACT

The present disclosure generally relates to semiconductor structures and, more particularly, to twisted wordline structures and methods of manufacture. The memory array structure includes: a plurality of bitcells comprising memory elements and access transistors; a plurality of bitlines and wordlines which interconnect the bitcells; a plurality of dummy bitcells which intersect with the bitlines and wordlines; and a plurality of twisted wordline strap cells which twist wordlines in the dummy bitcells and connect a higher metal layer in the bitcells to a gate structure of the access transistor.

20 Claims, 7 Drawing Sheets

B-B

C-C

D-D

F-F

US 11,004,491 B2

TWISTED WORDLINE STRUCTURES

FIELD OF THE INVENTION

The present disclosure generally relates to semiconductor structures and, more particularly, to twisted wordline structures and methods of manufacture.

BACKGROUND

Memory chips comprise an array of bitcells which are interconnected by bitlines and wordlines. The bitlines and wordlines are used to read and write binary values to each of the bitcells, with each of the bitcells representing a bit of information. Since each bitcell represents a bit of information and may be connected to other circuitry, it is desirable that the bitcells have the smallest area possible.

In magnetic random access memory (MRAM) applications, the implementation of poly-Si material as material for routing the wordlines in non-volatile memory (NVM) arrays can cause a performance bottleneck due to the resistance from the poly-Si material. Typical devices attempt to address this bottleneck by implementing a metal contact at top layers of the device. However, implementing a metal contact in a metal layer higher than the bitline not only increases the area of the bitcell, but also occupies the routing layers at top layers of the device. Accordingly, the metal contact can cause a relatively significant area penalty, thereby increasing the overall area of the bitcell, while limiting the upper layers of the device.

SUMMARY

In an aspect of the disclosure, a memory array structure comprises: a plurality of bitcells comprising memory elements and access transistors; a plurality of bitlines and wordlines which interconnect the bitcells; a plurality of dummy bitcells which intersect with the bitlines and wordlines; and a plurality of twisted wordline strap cells which twist wordlines in the dummy bitcells and connect a higher metal layer in the bitcells to a gate structure of the access transistor.

In an aspect of the disclosure, a structure comprises: a plurality of bitcells comprising nonvolatile memory elements and access transistors; a plurality of bitlines and wordlines which interconnect the bitcells; and two or more metal layers routed to construct wordline strap cells with the wordlines.

In an aspect of the disclosure, a structure comprises: a plurality of bitcells comprising magnetic tunnel junction (MTJ) memory elements and access transistors; a plurality of metal layers which extend from a gate of the access transistors to the MTJ memory elements; a plurality of selectlines, bitlines and wordlines which interconnect the bitcells; a plurality of dummy bitcells which intersect with the selectlines, bitlines and wordlines; and a plurality of twisted wordline strap cells which twist wordlines in the dummy bitcells and connect the metal layers to the gate structure of the access transistors.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
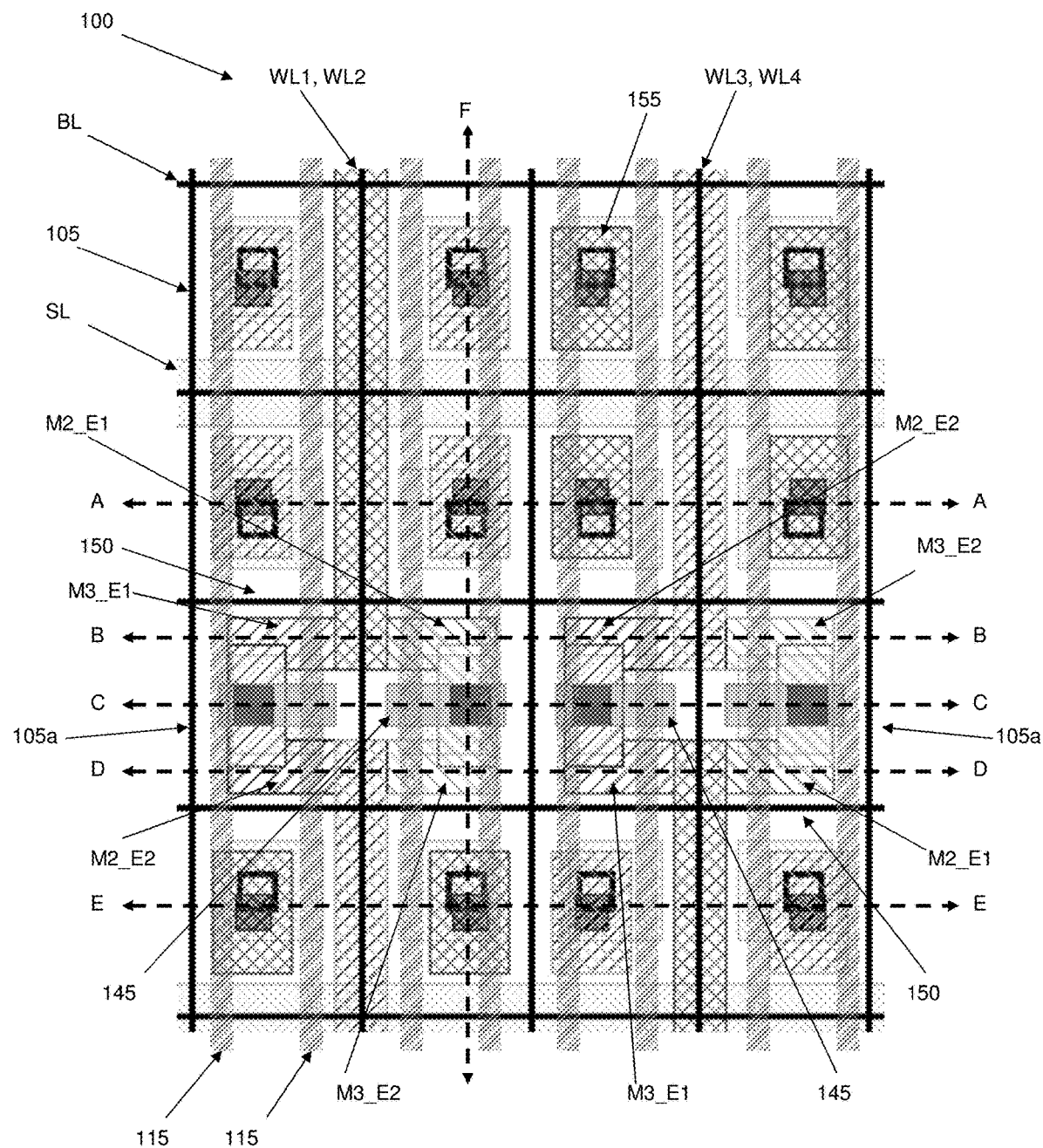
FIGS. 1A-1G show a memory array structure, amongst other features, and respective fabrication processes in accordance with aspects of the present disclosure.

The present disclosure generally relates to semiconductor structures and, more particularly, to twisted wordline structures and methods of manufacture. In embodiments, the processes and structures provided herein utilize a twisted wordline structure which is compatible to both selectline (SL) ∥ bitline (BL) and selectline (SL) ∥ wordline (WL) bitcell architectures. Advantageously, by using a twisted wordline structure, performance bottlenecks due to resistance is reduced while also maintaining an availability of the top levels of the device for routing, thereby improving device performance.

The twisted wordline structures are compatible with a plurality of bitcell designs, e.g., SL∥WL and SL∥BL bitcell architectures. Further, the SL∥BL MRAM bitcell architecture can be designed in the same area as the SL∥WL bitcell architecture, which can improve a read speed for the functional arrays of an embedded non-volatile memory (eNVM). In embodiments, the eNVM can be a resistive random-access memory (ReRAM) or a magnetic random access memory (MRAM).

In embodiments, the twisted wordline structure is implemented in lower metal layers of the eNVM, e.g., M2 and M3, which are lower than the layer having a magnetic tunnel junction (MTJ) memory element. In this way, the twisted wordline structure allows for higher layers of the eNVM array to be available for routing, while minimizing bitcell size and improving device performance. Additionally, the twisted wordline structure further improves device performance by providing balanced parasitics on a WL pair in different metal layers by having wordlines in adjacent bitcells periodically interchange their gate connectivity.

In embodiments, a dummy column is implemented within a dummy bitcell of the eNVM array for strapping the wordline. In this way, a WL strap is implemented inside the active array of the eNVM with a dummy column. Strapping the wordline to the metal layers of the eNVM improves the wordline resistance, because the metal material of the metal layers lowers the parasitic resistance from the poly-Si material of the wordlines. Further, the compact wordline strapping described herein provides WL strapping at multiple locations in the eNVM array, which results in a lower WL resistance for even for the farthest bitcell in the eNVM array.

Moreover, the structures and processes described herein allow for no limitation on array size while also providing a relative minimal area penalty, e.g., one bitcell height, compared to other devices. Additional advantages of the structures and processes described herein include a WL architecture which is independent of the selectline direction, and at least one top metal layer, which remains available for top level routing without disturbing the MTJ memory element. In this way, an MTJ-array continuity is retained to help patterning for the MTJs in rows adjacent to the wordline strapcell.

A structure provided herein includes a nonvolatile memory array comprising a plurality of bitcells which include a nonvolatile memory element and an access transistor, wherein two or more metal layers are routed to construct a WL strap. Accordingly, the bitcell comprises one or more memory elements and one or more access transistors. The different metal layers in the nonvolatile memory array are used to route WL straps in adjacent rows, with different metal wordlines in adjacent cells overlapping each other. Further, the metal wordlines in adjacent bitcells periodically interchange their gate connectivity to provide balanced parasitics on each WL, with the metal wordlines interchanging their gate connectivity at the dummy bitcell.

The structure further includes a dummy bitcell column used inside the active array of the nonvolatile memory array to strap to the gates of the access transistors. In embodiments, one of the higher metal level vias is removed to disconnect the nonvolatile memory element from the access transistor, while the WL metals are twisted to connect to the gates of the access transistors to avoid any additional area penalty. Further, a local contact connects the parallel gates of the access transistors in the dummy bitcell, while the dummy bitcell column can be repeated inside the array to reduce the WL parasitic resistance. Additionally, the contact to the active regions, e.g., contacts on silicide in source and drain regions, is removed to provide the gate contact to the access transistor. Further, the selectline is routed parallel to the WL or the selectline is routed parallel to the bitline.

Another structure provided herein includes an MRAM bitcell with a selectline in parallel to a bitline, wherein a magnetic tunnel junction (MTJ) element is used between different layers. The bitcell size is the same as the bitcell with the selectline direction at right angles to the bitline for the same drive strength device and metal stack. In addition, the bitline is routed in a higher layer at right angles to the gate, wherein the selectline is routed in a lower metal layer parallel to the BL. Further, the selectline is shared across two adjacent bitcells in the lower metal layer on a vertical edge. The selectline is also shared with adjacent bitcells on left and right regions in the diffusion regions, i.e., source and drain (S/D) regions.

In further embodiments, the wordlines for two adjacent bitcells can run over each other in higher metal layers (M2 and M3). In embodiments, the stacked island metals are used with related vias to provide connectivity of an internal node of the bitcell to a bottom electrode of the MTJ. In addition, a gate connection for the wordline is not present for higher metal layers and therefore needs a related WL strapcell for connection.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1B:
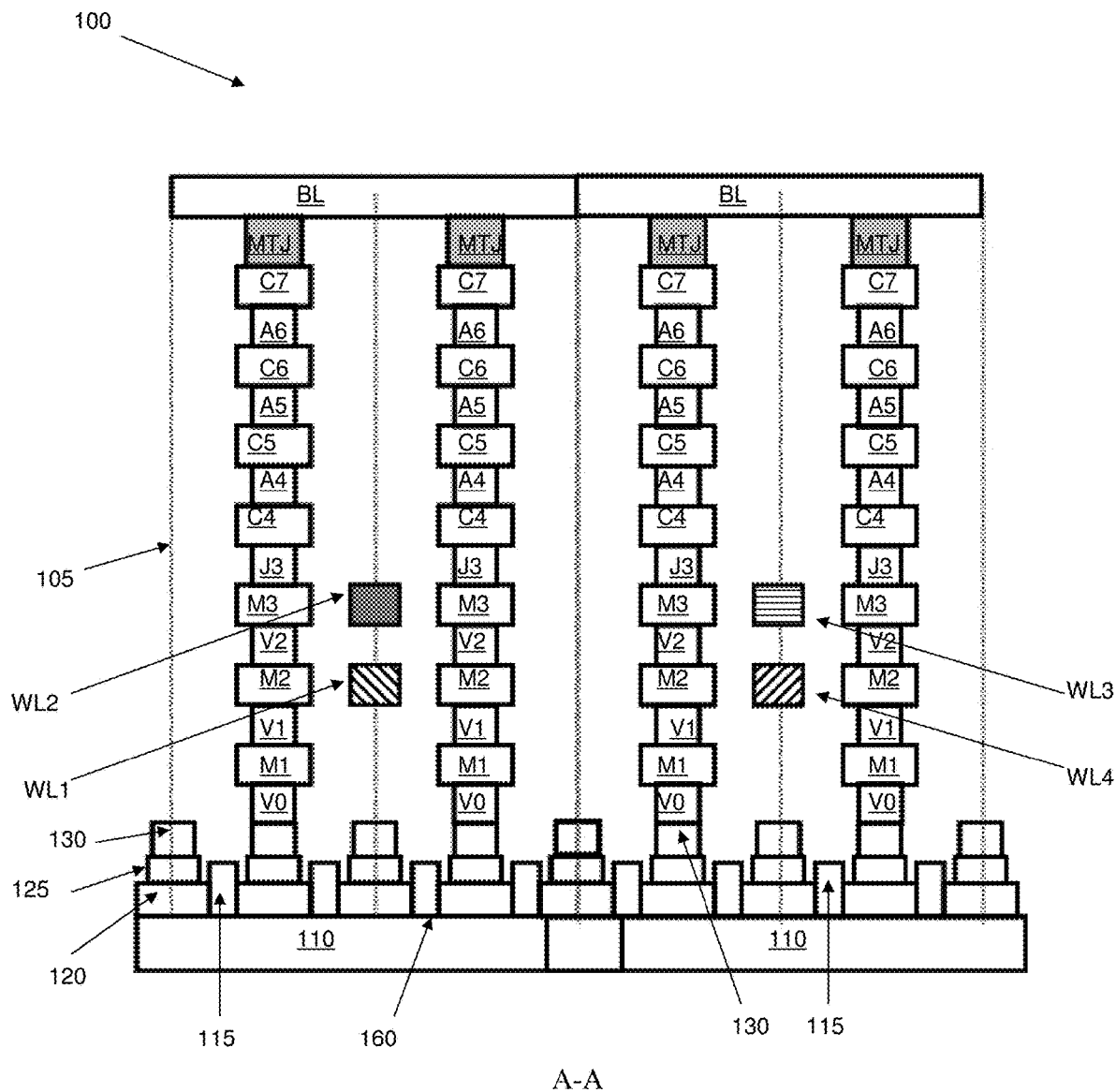
Figure 1C:
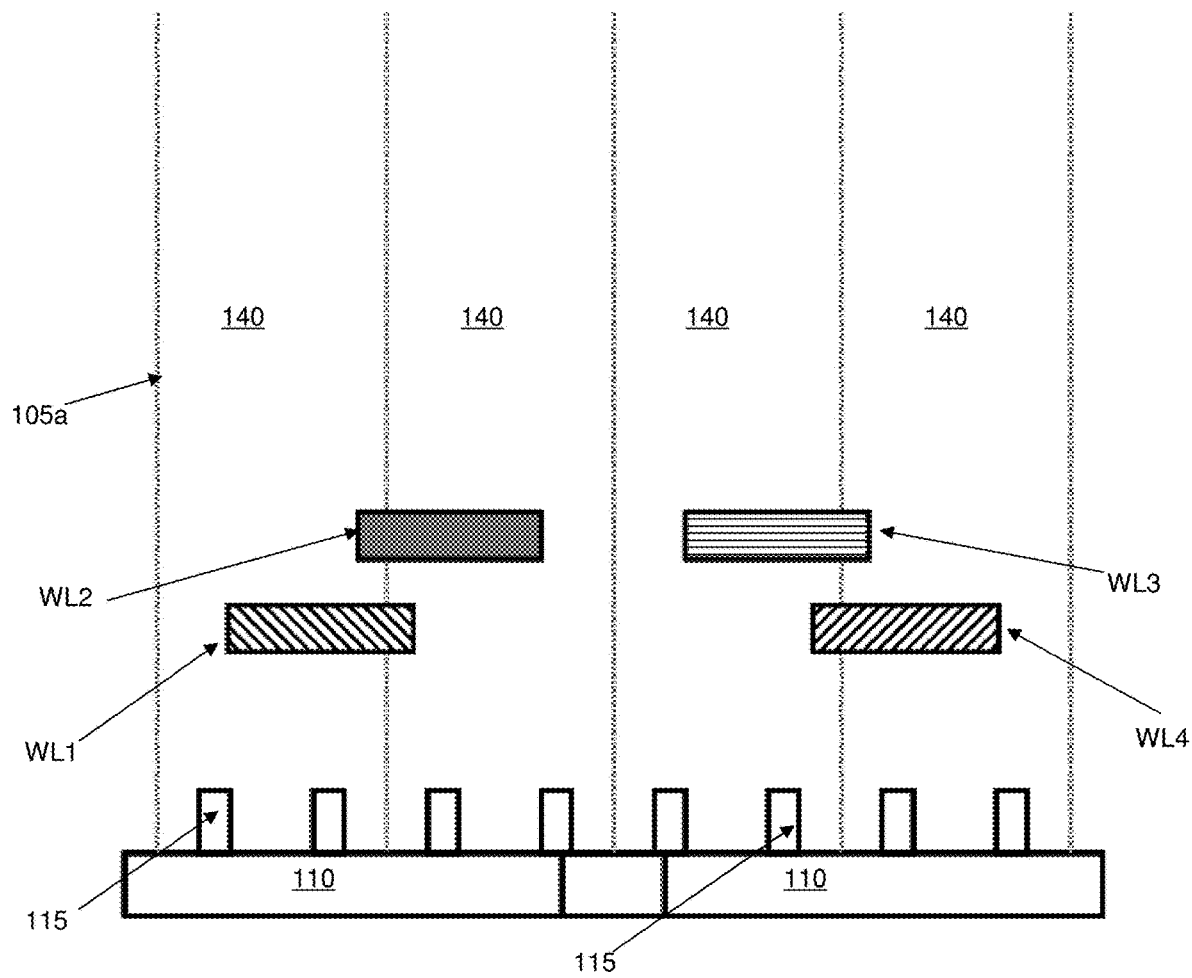
Figure 1D:
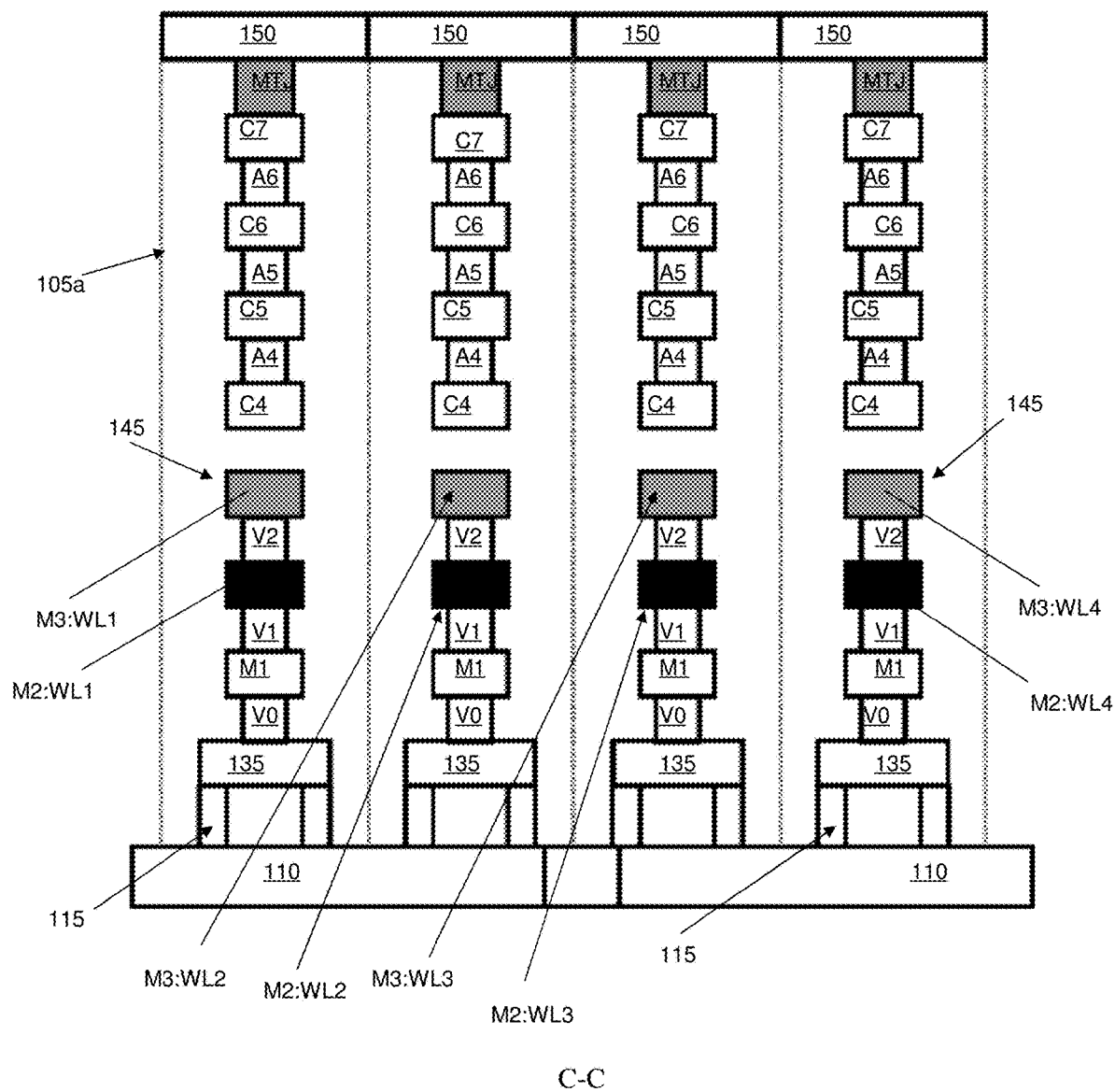
Figure 1E:
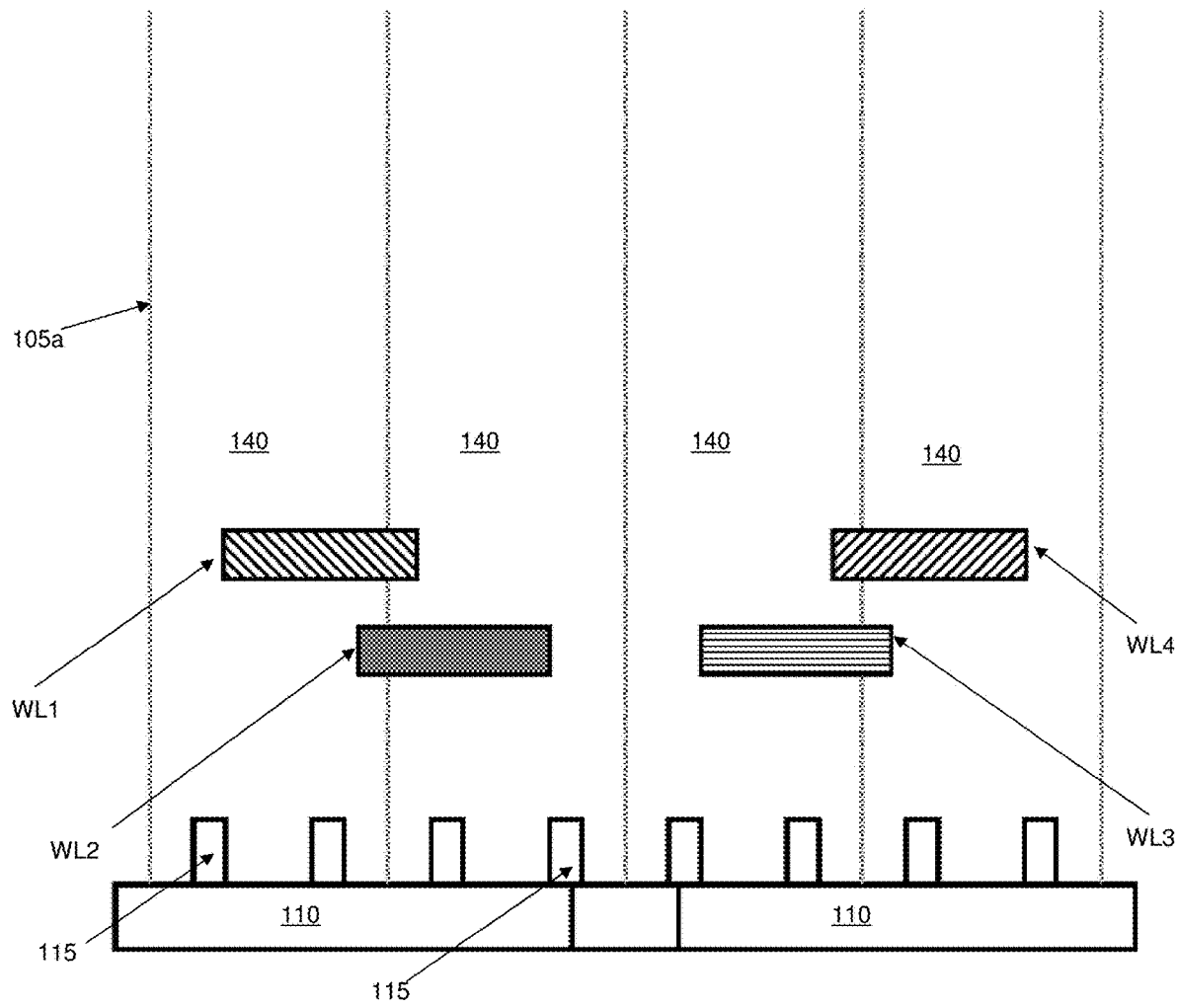
Figure 1F:
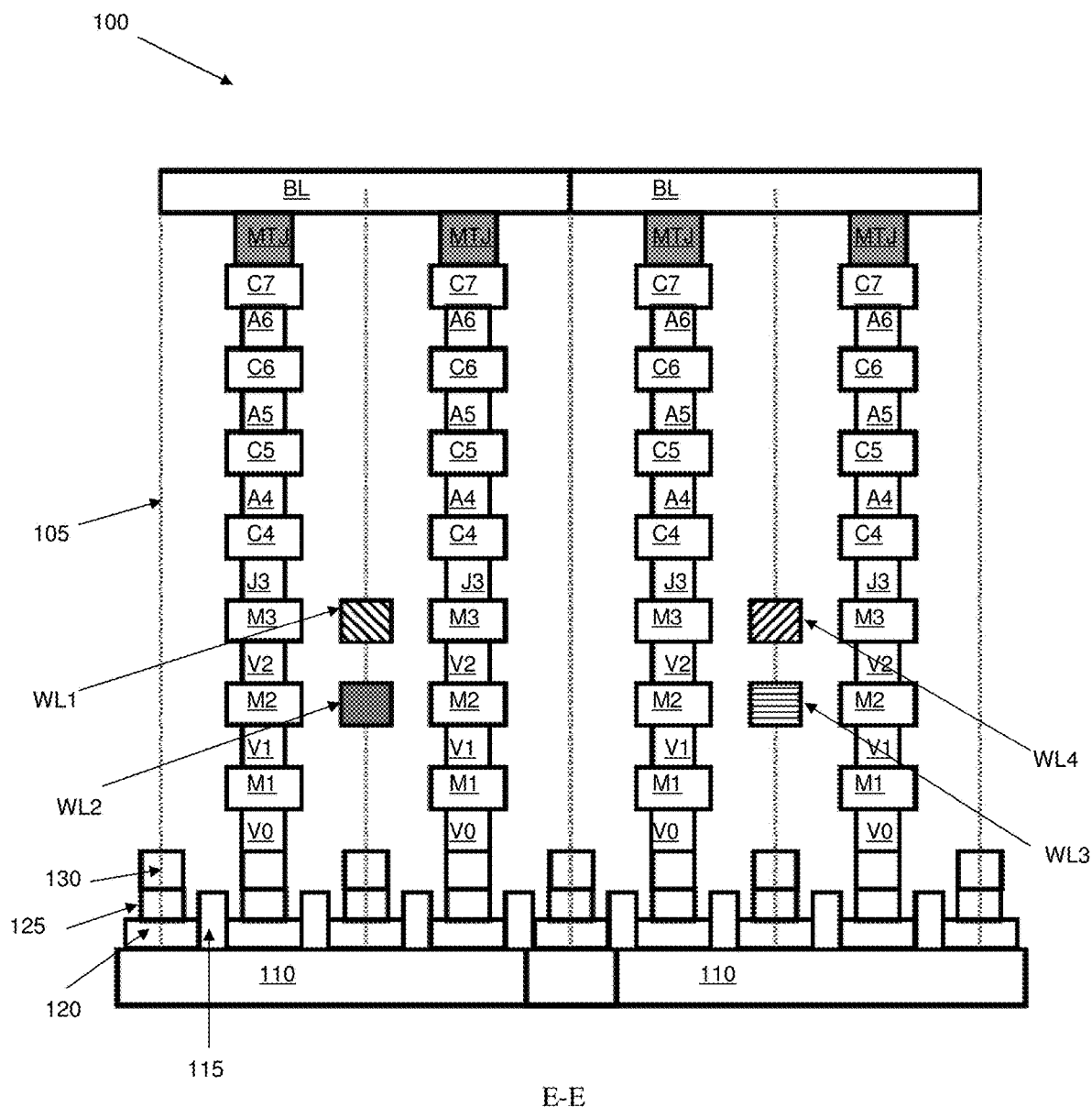
Figure 1G:
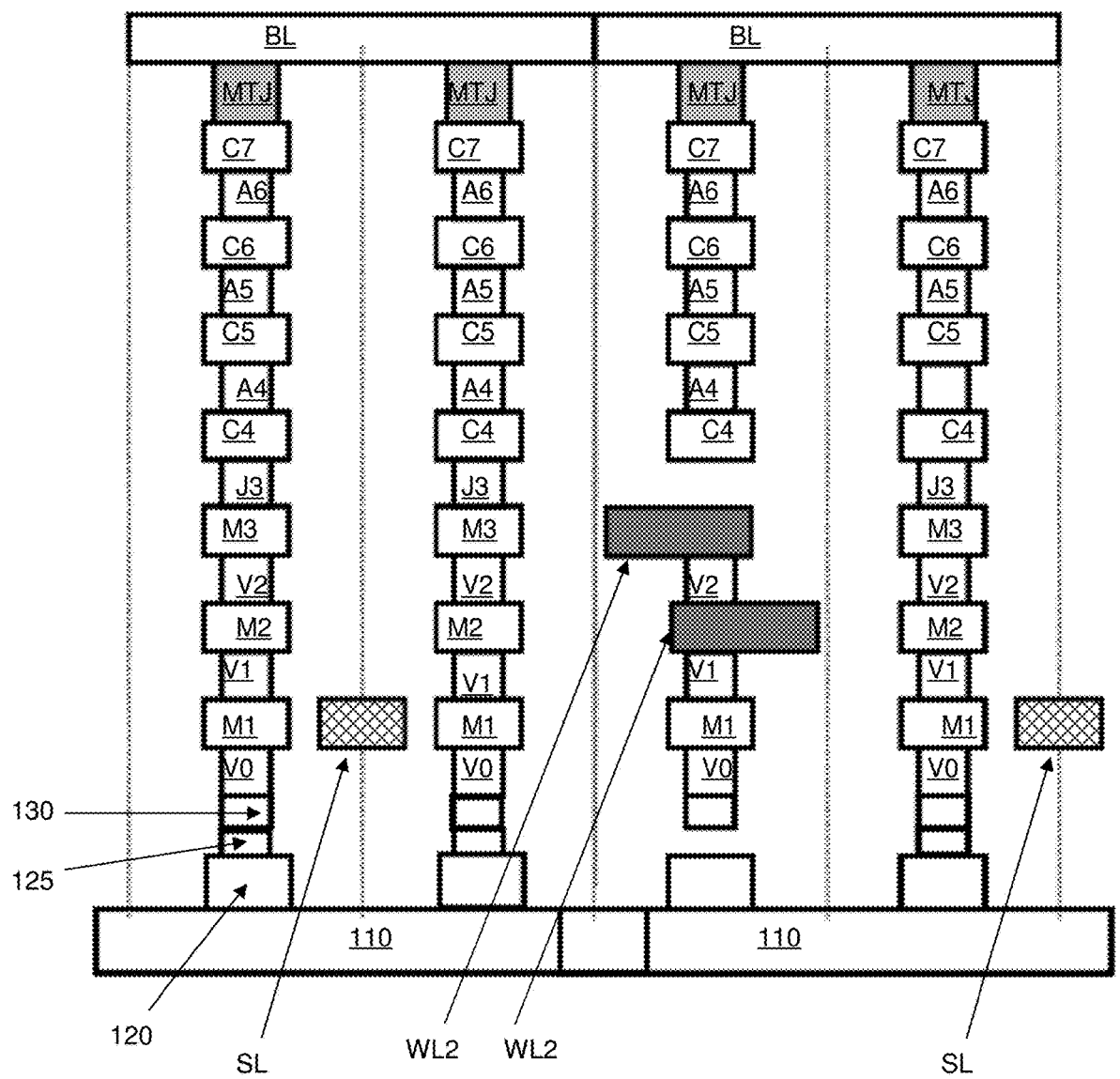

FIGS. 1A-1G show a memory array 100 and respective features in accordance with aspects of the present disclosure. Specifically, the memory array 100 depicts an embedded non-volatile memory (eNVM) array structure, e.g., resistive random-access memory (ReRAM) or magnetic random access memory (MRAM). FIG. 1A shows a top view of the memory array 100, FIG. 1B shows a cross section along an A-A axis of FIG. 1A, FIG. 1C shows a cross section along an B-B axis of FIG. 1A, FIG. 1D shows a cross section along a C-C axis of FIG. 1A, FIG. 1E shows a cross section along an D-D axis of FIG. 1A, FIG. 1F shows a cross section along an E-E axis of FIG. 1A and FIG. 1G shows a cross section along an F-F axis of FIG. 1A. The structures shown in FIGS. 1A-1G are implemented for MRAM devices, although these structures can also be implanted for ReRAM devices, depending on the storage element position in the stack of layers.

The memory array 100 includes a plurality of bitcells 105, with each bitcell 105 including a memory element 155. In embodiments, the memory element 155 comprises one or more memory elements, e.g., a nonvolatile memory element, and one or more access transistors 160. Accordingly, the bitcell 105 includes one or more memory elements 155 and one or more access transistors 160. In further embodiments, the memory array 100 is an MRAM device and the nonvolatile memory element 155 is a magnetic tunnel junction (MTJ). In this way, the memory elements 155 are nonvolatile memory elements and the nonvolatile memory elements are magnetic tunnel junction (MTJ) memory elements. The MTJ memory element 155 can be used between different upper layers of the memory array 100; however, it is also contemplated herein that the memory array 100 is a ReRAM device.

The bitcells 105 are interconnected by bitlines (BL) and wordlines (WL1, WL2, WL3, WL4), while selectlines (SL) connect the bitcells 105 together, shared between an adjacent pair of columns of the bitcells 105. In this way, the structures and processes described herein include selectlines which connect the bitcells. As illustrated in FIG. 1A, the selectline can be routed parallel to the bitline and the wordline. Accordingly, the selectlines are parallel to the bitlines and the wordlines, and the selectlines are shared across adjacent bitcells. In embodiments, the direction of the selectlines drives the size of the bitcells 105. Specifically, the size of the bitcell 105 is the same as the selectline direction is at right angles to the bitline for a same drive strength device and metal stack. Further, the bitline is routed in an upper metal layer at right angles to the gate structure 115 of the access transistor 160.

The bitlines (BL), selectlines (SL) and wordlines (WL) are used to read and write binary values to the memory element 155 of each bitcell 105, with each bitcell 105 representing a bit of information. In this way, an SLIIBL MRAM bitcell architecture is designed in the same area as an SLIIWL bitcell architecture, thereby improving read speed for functional arrays of the memory array 100 by utilizing the same area. Accordingly, the selectline (SL) can be routed parallel to the wordline (WL) or the selectline (SL) can be routed parallel to the bitline (BL).

The bitcells 105 comprise the nonvolatile MTJ memory elements 155 and one or more access transistors 160. Each access transistor 160 comprises a gate structure 115, source and drain (S/D) regions 120, metal plugs (silicide contacts) 125, S/D contacts 130 and gate contacts 135, with metal layers V0, M1, V1, M2, V2, M3, J3, C4, A4, C5, A5, C6, C7 (V0-C7) extending from the S/D contacts 130 in the bitcells 105. The MTJ memory element 155 and access transistor 160 are over the substrate 110. In embodiments, the substrate 110 can be a p-type substrate.

The memory array 100 further includes a plurality of dummy bitcells 105a, which do not contain the memory element 155 found within the bitcells 105. As shown in FIG. 1D, the metal layers V0-C7 can extend from the gate contact 135 in the dummy bitcells 105a. In this way, the structures and processes described herein include a stack of metals V0-C7 connecting an internal node of the bitcell 105 to a bottom electrode of the MTJ memory elements 155. In embodiments, the gate contact 135 is a local contact which connects parallel gate structures 115 of the access transistors 160 in the dummy bitcell 105a. In this way, memory array 100 includes contacts 135 which connect parallel gate structures 115 of the access transistors 160 in select bitcells 105. In further embodiments, the metal plug contact to the active regions, i.e., metal plugs (silicide contacts) 125, can be removed to provide the gate contact 135 to the access transistor 160, i.e., gate structures 115.

Continuing with FIG. 1D, one of the higher metal level vias, e.g., J3 shown in FIG. 1B, can be removed to disconnect the nonvolatile MTJ memory element 155 from the access transistor 160. In this way, the memory array 100 includes a plurality of dummy bitcells 105a which intersect with the bitlines and wordlines, and the wordline strap cells are twisted wordline strap cells within the dummy bitcells 105a to connect a higher metal layer of the bitcells 105 to a gate structure 115 of the access transistor 160.

The lack of the memory element 155 within the dummy bitcells 105a results in a dummy column 140, as illustrated in FIGS. 1C and 1E. The dummy column 140 allows for each wordline (WL) of the wordlines WL1, WL2, WL3, WL4 to be strapped to metal layers because no memory element 155 is present to obstruct the wordlines WL1, WL2, WL3, WL4 from the metal layers M1, M2, M3, etc. In this way, the cell of the dummy column 140 can be used as a wordline (WL) strapcell. Accordingly, the twisted wordline strap cells are below the MTJ memory elements 155.

Since there is no memory element 155 within the dummy bitcells 105a, the bitlines which border the dummy bitcells 105a are dummy bitlines 150, due to the lack of the memory element 155. Accordingly, the structures and processes described herein include a plurality of bitcells 105 comprising memory elements 155 and access transistors 160. Further, the structures and processes include a plurality of bitlines and wordlines which interconnect the bitcells 105, and a plurality of dummy bitcells 105a which intersect with the bitlines and wordlines.

The memory array 100 further includes a plurality of twisted wordline strap cells (cells of the dummy columns 140) which twist wordlines in the dummy bitcells 105a and connect a higher metal layer in the bitcells 105 to a gate structure 115 of the access transistor 160. Accordingly, the structures and processes described herein are arranged so that the bitcells 105 are in a plurality of rows and the twisted wordline strap cells route the wordlines in adjacent bit cells 105. In this way, the wordline strap cells in adjacent bitcells 105 overlap each other. Specifically, the wordlines in the adjacent bitcells 105 overlap each other, and wordlines for two adjacent bitcells 105 are over each other in a second metal layer M2 and a third metal layer M3 of the adjacent bitcells 105.

Continuing with FIG. 1B, the wordlines WL1, WL2, WL3, WL4 can be strapped to metal layers which are lower than a layer having the nonvolatile memory element 155, i.e., the MTJ memory device. In embodiments, the wordlines WL1, WL2, WL3, WL4 can be strapped to metal layers M2 and M3, which are lower than the MTJ layer. However, it is also contemplated herein that any metal layers lower than the layer having the MTJ device can have the wordlines WL1, WL2, WL3, WL4 strapped thereto. For example, the wordlines WL1, WL2, WL3, WL4 can be strapped to metal layers M1, M2, amongst other examples. In further embodiments, the metal layers M2, M3 can be at different regions of the memory array 100. Specifically, the metal layers M2, M3 can be at regions E1 and E2, i.e., M2_E1, M2_E2, M3_E1, M3_E2.

Strapping the wordlines WL1, WL2, WL3, WL4 to metal layers lower than the layer having the MTJ device allows for upper layers of the memory array 100 at or above the MTJ device, e.g., layers C7-K2, to be available for routing. In this way, the memory array 100 includes a metal layer above the nonvolatile memory elements 155 which remains available for routing. In embodiments, the structures and processes described herein use orthogonal routings. By increasing the availability of layers for routing, device performance can be improved without disturbing the MTJ memory device. In this way, the structures and processes described herein retain MTJ-array continuity to help patterning for the MTJs in rows adjacent to the wordline strapcell.

FIG. 1D illustrates the strapping of the wordlines WL1, WL2, WL3, WL4 to each of the metal layers M2, M3. In embodiments, the dummy column 140 of the dummy bitcell 105a is used inside the active array of the memory array 100 as strapcells to strap the wordlines WL1, WL2, WL3, WL4 to the gate structures 115 of the access transistors 160. In this way, two or more metal layers are routed to construct the WL strap 145, with different metal layers being used to route WL straps 145 in adjacent rows of the bitcells 105.

Referring FIG. 1D, in a first column of the memory array 100, the WL strap 145 straps the first wordline WL1 to metal layers M2, M3, i.e., strapcells M2:WL1, M3:WL1. In this way, the first wordline WL1 in the metal layers M2 and M3 is strapped together in a same strap cell. In a second column, the WL strap 145 straps the second wordline WL2 to metal layers M2, M3, i.e., strapcells M2:WL2, M3:WL2. In a third column of the memory array 100, the WL strap 145 straps the third wordline WL3 to metal layers M2, M3, i.e., strapcells M2:WL3, M3:WL3. In a fourth column, the WL strap 145 straps the fourth wordline WL4 to metal layers M2, M3, i.e., strapcells M2:WL4, M3:WL4. In this way, the dummy bitcells 105a can be repeated inside the array of the memory array 100 to reduce the wordline parasitic resistance and the wordlines in metal layers M2, M3 are strapped together in a same strapcell, i.e., dummy column 140.

In embodiments, the metal layer/wordline strapcells M2:WL1, M3:WL1, M2:WL2, M3:WL2, M2:WL3, M3:WL3, M2:WL4, M3:WL4 are twisted to connect to the gate structures 115 of the access transistors 160 to avoid any additional area penalty. Specifically, the wordlines WL1, WL2, WL3, WL4 are in lower metal layers M2 and M3, with the twist of the wordlines WL1, WL2, WL3, WL4 occurring in the wordline strapcell.

By strapping each wordline of the wordlines WL1, WL2, WL3, WL4 to the lower metal layers of the memory array 100, a parasitic resistance associated with each wordline of the wordlines WL1, WL2, WL3, WL4 can be reduced. Accordingly, the structures and processes described herein include a plurality of bitcells 105 comprising nonvolatile memory elements 115 and access transistors 160. Further, the memory array 100 includes a plurality of bitlines and wordlines which interconnect the bitcells 105. Additionally, two or more metal layers M2 and M3 are routed to construct wordline strap cells with the wordlines.

As shown in FIG. 1D, the structures and processes described herein have a wordline in lower metal layers M2 and M3 by using a dummy column 140 as the wordline strapcell, with an upper metal layer available for top level routing. Having a wordline in a lower metal layer eliminates the resistance on the wordline from the additional stack via. In this way, the WL straps 145 provide for a twisted wordline structure in lower metal layers than the MTJ, thereby leaving higher metal layers available for routing. Additionally, the twisted wordline structure gives balanced parasitics on the wordline pair, e.g., WL1 and WL2, in different metal layers. Further, the dummy column 140 can be used as the wordline strapcell, and the twisted wordline structure can be applied to both bitcell designs, e.g., SLIIBL and SLIIWL bitcell architectures. In embodiments, the SLIIBL MRAM bitcell architecture is designed in the same area as the SLIIWL bitcell architecture, thereby improving read speed for the functional arrays.

As shown in FIG. 1D, a gate connection (gate contact 135) is not present for higher metal layers, i.e., C4-C7, and needs the usage of a related wordline strapcell, i.e., M2:WL1, M3:WL1, M2:WL2, M3:WL2, M2:WL3, M3:WL3, M2:WL4, M3:WL4, for connection. Further, the metal layer/wordline strapcells M2:WL1, M3:WL1, M2:WL2, M3:WL2, M2:WL3, M3:WL3, M2:WL4, M3:WL4 in adjacent dummy bitcells 105a can periodically interchange their gate connectivity to the gate structures 115 to provide balanced parasitics on each wordline of the wordlines WL1, WL2, WL3, WL4. In this way, the wordline strap cells interchange their gate connectivity at select bitcells. Accordingly, the metal layer/wordline strapcells M2:WL1, M3:WL1, M2:WL2, M3:WL2, M2:WL3, M3:WL3, M2:WL4, M3:WL4 interchange their gate connectivity at the dummy bitcell 105a. By providing balanced parasitics on each wordline, device performance is further improved by increasing the read/write speed of the bitlines and the wordlines.

Referring to FIGS. 1E and 1F, the twisted structure of the metal layer/wordline combinations M2:WL1, M3:WL1, M2:WL2, M3:WL2, M2:WL3, M3:WL3, M2:WL4, M3:WL4 is further shown. In FIGS. 1B and 1C, the second wordline WL2 is over the first wordline WL1, while the third wordline WL3 is over the fourth wordline WL4. Due to the strapping of the wordlines WL1, WL2, WL3, WL4, which results in a twisted structure of the metal layer/wordline combinations M2:WL1, M3:WL1, M2:WL2, M3:WL2, M2:WL3, M3:WL3, M2:WL4, M3:WL4, the positioning of the wordlines WL1, WL2, WL3, WL4 is changed. Specifically, in FIGS. 1E and 1F, the first wordline WL1 is over the second wordline WL2, while the fourth wordline WL4 is over the third wordline WL3.

Accordingly, the structures and processes described herein use a wordline strap 145 inside the active array of the memory array 100 with a dummy column 140. This allows for no limitation on an array size of the memory array 100, while providing a minimum area penalty, e.g., 1 bitcell height, with an upper metal layer remaining available for routing. Further, the compact wordline strapping cell provides wordline strapping at both directions of the memory array 100, resulting in lower wordline resistance for a farthest bitcell. Additionally, as shown in FIGS. 1A-1F, the twisted wordline structure is independent of the selectline direction.

FIG. 1G illustrates the selectline parallel to the wordline. More specifically, the selectline is parallel to the second wordline WL2. As shown in FIG. 1G, the selectline is routed in metal layer M1, parallel to the bitline. Further, the selectline is shared across two adjacent bitcells 105 in the lower metal layer M1 on a vertical edge of the bitcell 105. Specifically, the selectline is shared with adjacent bitcells 105, on left and right sides of the diffusion regions, i.e., S/D regions 120.

Continuing with FIG. 1G, a wordline for two adjacent bitcells 105 can run over each other in metal layers M2, M3. Specifically, FIG. 1G shows the second wordline WL2 running over each other in the metal layers M2, M3. Additionally, the stack island of metals from M1 to C7 are used with related vias, i.e., V1, V2, to provide the connectivity of an internal node of a bitcell 105 to a bottom electrode of the MTJ, i.e., C7.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory array structure, comprising:
    a plurality of bitcells comprising memory elements and access transistors;
    a plurality of bitlines and wordlines which interconnect the bitcells;
    a plurality of dummy bitcells which intersect with the bitlines and wordlines; and
    a plurality of twisted wordline strap cells which twist wordlines in the dummy bitcells and connect a higher metal layer in the bitcells to a gate structure of the access transistor.

2. The structure of claim 1, wherein the memory elements are nonvolatile memory elements, and wherein the wordlines are comprised of poly Si.

3. The structure of claim 2, wherein the nonvolatile memory elements are magnetic tunnel junction (MTJ) memory elements.

4. The structure of claim 3, wherein the twisted wordline strap cells are below the MTJ memory elements.

5. The structure of claim 4, further comprising a stack of metals connecting an internal node of the bitcell to a bottom electrode of the MTJ memory elements.

6. The structure of claim 1, wherein the bitcells are in a plurality of rows and the twisted wordline strap cells route the wordlines in adjacent bit cells.

7. The structure of claim 6, wherein the wordlines in the adjacent bitcells overlap each other.

8. The structure of claim 6, wherein the wordlines for two adjacent bitcells are over each other in a second metal layer and a third metal layer of the adjacent bitcells.

9. The structure of claim 6, further comprising selectlines which connect the bitcells.

10. The structure of claim 9, wherein the selectlines are parallel to the bitlines.

11. The structure of claim 9, wherein the selectlines are shared across adjacent bitcells.

12. A structure, comprising:
    a plurality of bitcells comprising nonvolatile memory elements and access transistors;
    a plurality of bitlines and wordlines which interconnect the bitcells, wherein the wordlines comprise poly-Si;
    two or more metal layers routed to construct wordline strap cells with the wordlines and
    a plurality of dummy bitcells which intersect with the bitlines and wordlines,
    wherein the wordline strap cells are twisted wordline strap cells within the dummy bitcells to connect a higher metal layer of the bitcells to a gate structure of the access transistor.

13. The structure of claim 12, wherein the wordline strap cells interchange their gate connectivity at select bitcells.

14. The structure of claim 12, wherein the twisted wordline strap cells route the wordlines in adjacent bitcells, wherein the bitcells are in a plurality of rows, and wherein the wordlines for two adjacent bitcells are over each other in a second metal layer and a third metal layer of the adjacent bitcells.

15. The structure of claim 12, wherein the wordline strap cells in adjacent bitcells overlap each other.

16. The structure of claim 12, further comprising a metal layer above the nonvolatile memory elements which remains available for routing.

17. The structure of claim 12, further comprising contacts which connect parallel gate structures of the access transistors in select bitcells.

18. A structure, comprising:
    a plurality of bitcells comprising magnetic tunnel junction (MTJ) memory elements and access transistors;
    a plurality of metal layers which extend from a gate of the access transistors to the MTJ memory elements;
    a plurality of selectlines, bitlines and wordlines which interconnect the bitcells;
    a plurality of dummy bitcells which intersect with the selectlines, bitlines and wordlines; and
    a plurality of twisted wordline strap cells which twist wordlines in the dummy bitcells and connect the metal layers to the gate structure of the access transistors.

19. The structure of claim 18, wherein the twisted wordline strap cells are below the MTJ memory elements, and wherein the wordlines are comprised of poly Si.

20. The structure of claim 18, wherein the twisted wordline strap cells route the wordlines in adjacent bitcells, wherein the bitcells are in a plurality of rows, and wherein the wordlines for two adjacent bitcells are over each other in a second metal layer and a third metal layer of the adjacent bitcells.

* * * * *